US006809424B2

(12) United States Patent
Pike et al.

(10) Patent No.: US 6,809,424 B2
(45) Date of Patent: Oct. 26, 2004

(54) METHOD FOR MAKING ELECTRONIC DEVICES INCLUDING SILICON AND LTCC AND DEVICES PRODUCED THEREBY

(75) Inventors: Randy T. Pike, Indian Harbour Beach, FL (US); Charles M. Newton, South East Palm Bay, FL (US); Carol Gamlen, Melbourne, FL (US); Raymond C. Rumpf, Melbourne, FL (US); Betty O'Dowd, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 26 days.

(21) Appl. No.: 09/741,754

(22) Filed: Dec. 19, 2000

(65) Prior Publication Data

US 2002/0130408 A1 Sep. 19, 2002

(51) Int. Cl.$^7$ .................. H01L 23/48; H01L 23/52; H01L 29/40
(52) U.S. Cl. ............................................ 257/782
(58) Field of Search ................. 257/782, 783, 257/714, 706, 712; 361/719, 720, 689, 699; 174/252

(56) References Cited

U.S. PATENT DOCUMENTS

| | | | |
|---|---|---|---|
| 3,540,957 A | 11/1970 | Bawa | 156/89 |
| 3,783,218 A | 1/1974 | Adams et al. | 219/10.53 |
| 4,295,115 A | 10/1981 | Takahashi et al. | 338/4 |
| 4,452,624 A | 6/1984 | Wohltjen et al. | 65/40 |
| 4,481,497 A | 11/1984 | Kurtz et al. | 338/2 |
| 4,638,552 A | 1/1987 | Shimbo et al. | 29/576 |
| 5,396,042 A | 3/1995 | Ishida et al. | 219/78.02 |
| 5,406,108 A | 4/1995 | Inada | 257/415 |
| 5,411,919 A | 5/1995 | Inada | 437/209 |
| 5,443,890 A | 8/1995 | Ohman | 428/167 |
| 5,493,305 A | 2/1996 | Wooldridge et al. | 342/368 |
| 5,591,679 A | 1/1997 | Jakobsen et al. | 437/228 |
| 5,600,541 A | 2/1997 | Bone et al. | 361/707 |
| 5,611,876 A | 3/1997 | Newton et al. | 156/89 |
| 5,621,837 A | 4/1997 | Yamada et al. | 385/88 |
| 5,672,826 A | 9/1997 | Suzuki et al. | 73/754 |
| 5,755,942 A | 5/1998 | Zanzucchi et al. | 204/454 |
| 5,814,883 A * | 9/1998 | Sawai et al. | 257/712 |
| 5,820,648 A | 10/1998 | Akaike et al. | 65/36 |
| 5,866,469 A | 2/1999 | Hays | 438/456 |
| 5,892,279 A * | 4/1999 | Nguyen | 257/712 |
| 6,013,562 A | 1/2000 | Kemmer | 438/455 |
| 6,091,146 A | 7/2000 | Berkely et al. | 257/730 |
| 6,377,461 B1 * | 4/2002 | Ozmat et al. | 361/704 |
| 6,462,410 B1 * | 10/2002 | Novotny et al. | 257/707 |

FOREIGN PATENT DOCUMENTS

WO  WO 01/29890  *  4/2001

* cited by examiner

Primary Examiner—David A. Zarneke
(74) Attorney, Agent, or Firm—Allen, Dyer, Doppelt, Milbrath & Gilchrist, P.A.

(57) ABSTRACT

A method for making an electronic device includes positioning first and second members so that opposing surfaces thereof are in contact with one another, the first member comprising silicon and the second member comprising a low temperature co-fired ceramic (LTCC) material. The method further includes anodically bonding together the opposing surfaces of the first and second members to form a hermetic seal therebetween. The anodic bonding provides a secure and strong bond between the members without using adhesive. The method may further include forming at least one cooling structure in at least one of the first and second members. The least one cooling structure may comprise at least one first micro-fluidic cooling structure in the first member, and at least one second micro-fluidic cooling structure in the second member aligned with the at least one first micro-fluidic cooling structure.

14 Claims, 4 Drawing Sheets

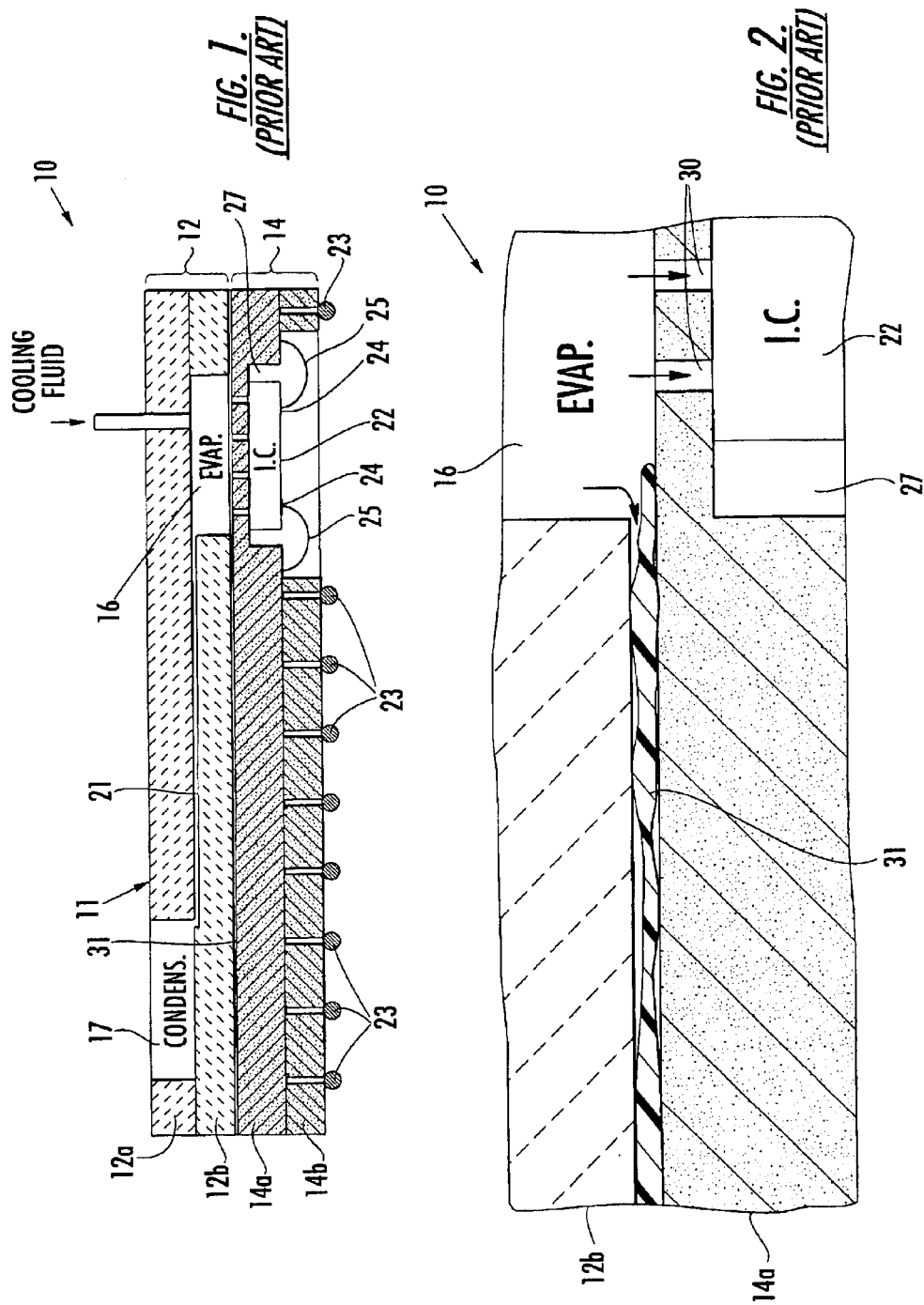

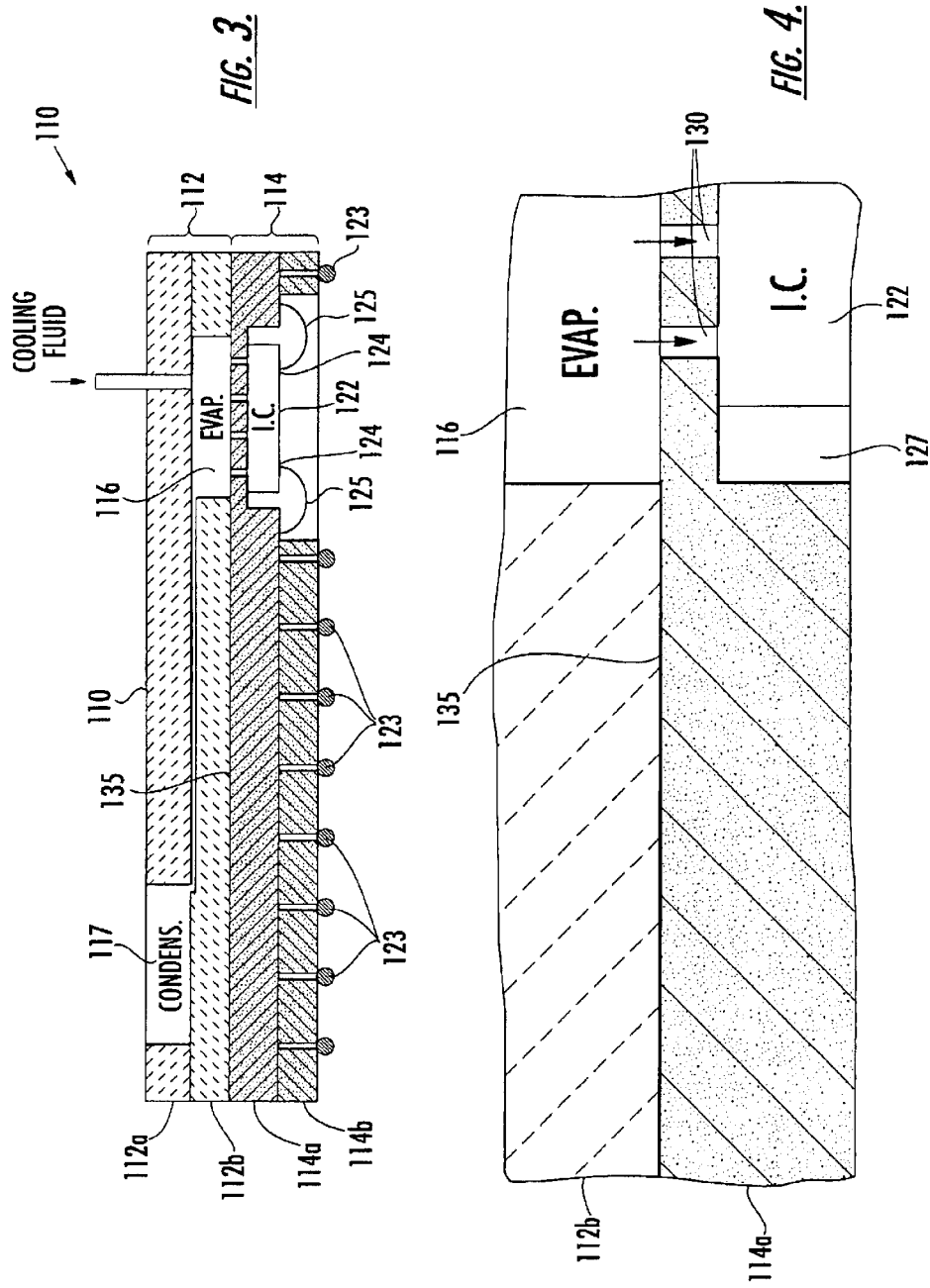

US 6,809,424 B2

METHOD FOR MAKING ELECTRONIC DEVICES INCLUDING SILICON AND LTCC AND DEVICES PRODUCED THEREBY

FIELD OF THE INVENTION

The present invention relates to the field of electronic devices and manufacturing methods, and, more particularly, to methods for making and devices such as including packaged integrated circuits.

BACKGROUND OF THE INVENTION

Integrated circuits are widely used in many types of electronic equipment. An integrated circuit may include a silicon substrate in which a number of active devices, such as transistors, etc., are formed. It is also typically required to support one or more such integrated circuits in a package that provides protection and permits external electrical connection.

As the density of active devices on typical integrated circuits has increased, dissipation of the heat generated has become increasingly more important. Designers have developed cooling techniques for integrated circuits based on micro-electromechanical (MEMs) technology.

For example, as shown in FIG. 1, a prior art electronic device 10 includes a package 11 including a first member 12 comprising silicon, and a second member 14 comprising a low temperature co-fired ceramic (LTCC) material. The first member 12 may include several stacked silicon substrates 12a, 12b having various components of a micro-fluidic cooler formed therein. For example, as shown in the illustrated embodiment, an evaporator 16 and condensor 17 may be provided and interconnected via one or more micro-fluidic channels or passageways 21 formed between the silicon substrates 12a, 12b. One or more MEMs pumps, not shown, may circulate the cooling fluid.

The second member 14 may also include several LTCC layers 14a, 14b laminated together as shown in the illustrated embodiment. The second member 14 also illustratively carries an integrated circuit 22, such as an insulated gate bipolar transistor (IGBT) or other integrated circuit that may typically generate substantial waste heat. The second member 14 also includes external connections 23 which are connected to the electrical connections 24 of the integrated circuit 22 via the illustrated wires 25.

As shown in the enlarged view of FIG. 2, the integrated circuit 22 is carried by a receiving recess 27 in the second member 14. A series of micro-fluidic passageways 30 may be provided through the LTCC member 14 adjacent the integrated circuit 22 to deliver cooling fluid thereto.

Typically, the LTCC member 14 and the silicon member 12 are adhesively joined together as schematically illustrated by the adhesive layer 31. Thermoplastic and/or thermosetting adhesives are commonly used. Metal layers may also be used. Unfortunately, the adhesive layer 31 has a number of shortcomings. The adhesive layer 31 may not typically provide a hermetic seal at the interface between the silicon and LTCC, thus, cooling fluid may be lost. In addition, the adhesive layer 31 may also provide yet another layer through which the heat must pass. Of course, it may be difficult to provide an adhesive layer 31 which is uniform and which does not protrude into the interface or otherwise block or restrict the flow of cooling fluid. In other words, such an adhesive layer 31 unfortunately provides only non-hermetic and non-uniform bonding the members.

U.S. Pat. No. 5,443,890 to Ohman discloses a leakage resistant seal for a micro-fluidic channel formed between two adjacent members. A sealing groove is provided and filled with a fluid sealing material which is compressed against adjacent surface portions of the opposing member. The provision for such a sealing structure requires additional manufacturing steps and may not be suitable for many applications.

SUMMARY OF THE INVENTION

In view of the foregoing background, it is therefore an object of the invention to provide a method and associated electronic device wherein LTCC and silicon members are bonded together to form a hermetic seal with uniform bonding.

This and other objects, features and advantages in accordance with the present invention are provided by a method for making an electronic device comprising positioning first and second members so that opposing surfaces thereof are in contact with one another, the first member comprising silicon and the second member comprising a low temperature co-fired ceramic (LTCC) material. The method also includes anodically bonding together the opposing surfaces of the first and second members to form a hermetic seal therebetween. The anodic bonding provides a secure and uniform bond between the members.

The first and second members may have substantially planar major opposing surfaces. The anodic bonding provides a uniform bond across these surfaces to reduce possible stress effects which may otherwise occur due to the difference in thermal coefficients of expansion of the two different materials.

Anodically bonding may comprise applying a voltage across the first and second members, applying pressure to the opposing surfaces of the first and second members, and/or heating the first and second members. The method may also include cleaning the opposing surfaces of the first and second members prior to anodically bonding the members.

The method may further include forming at least one cooling structure in at least one of the first and second members. More particularly, the least one cooling structure may comprise at least one first micro-fluidic cooling structure in the first member, and at least one second micro-fluidic cooling structure in the second member aligned with the at least one first micro-fluidic cooling structure. The at least one first micro-fluidic cooling structure may comprise an evaporator and the at least one second micro-fluidic cooling structure may comprise at least one micro-fluidic passageway. Anodic bonding permits a hermetic seal between the two members, and significantly reduces or eliminates the loss of cooling fluid at the interface between the two members which could otherwise occur.

The method may also include positioning at least one integrated circuit adjacent the at least one cooling structure, such as adjacent the at least one micro-fluidic cooling passageway in the second member. The at least one integrated circuit may comprise electrical connections, and the second member may carry external electrical connections connected to the electrical connections of the at least one integrated circuit.

For typical electronic devices, the anodically bonding may comprise applying a voltage in a range of about 500 to 1000 volts across the first and second members. Similarly, the anodically bonding may comprise applying pressure in a range of about 1 to 20 psi to the opposing surfaces of the first and second members. Continuing along these lines, the anodically bonding may comprise heating the first and second members to a temperature in a range of about 100 to 150° C.

Another aspect of the invention relates to an electronic device, such as a multi-chip module (MCM) or other similar packaged integrated circuit, for example. The electronic device may comprise a first member comprising silicon, and a second member comprising a low temperature co-fired ceramic (LTCC) material. Moreover, the first and second members have opposing surfaces thereof anodically bonded together to form a hermetic seal therebetween. The first and second members may have opposing generally planar major opposing surfaces, for example.

At least one of the first and second members may comprise at least one cooling structure. For example, the first member may comprise at least one first micro-fluidic cooling structure therein, such as an evaporator. In addition, the second member may further comprise at least one second micro-fluidic cooling structure aligned with the at least one first micro-fluidic cooling structure of the first member. For example, the at least one second micro-fluidic cooling structure may comprise at least one micro-fluidic passageway.

The electronic device may also include at least one integrated circuit adjacent the at least one second microfluidic cooling structure of the second member. The at least one integrated circuit may also comprise electrical connections. Accordingly, the second member may comprise external electrical connections connected to the electrical connections of the at least one integrated circuit.

BRIEF DESCRIPTION OF THE DRAWINGS

FIG. 1 is a schematic cross-sectional view of an electronic device according to the prior art.

FIG. 2 is a greatly enlarged view of a portion of the electronic device as shown in FIG. 1.

FIG. 3 is a schematic cross-sectional view of an electronic device in accordance with the present invention.

FIG. 4 is a greatly enlarged portion of the electronic device as shown in FIG. 3.

DETAILED DESCRIPTION OF THE PREFERRED EMBODIMENTS

Figure 5:
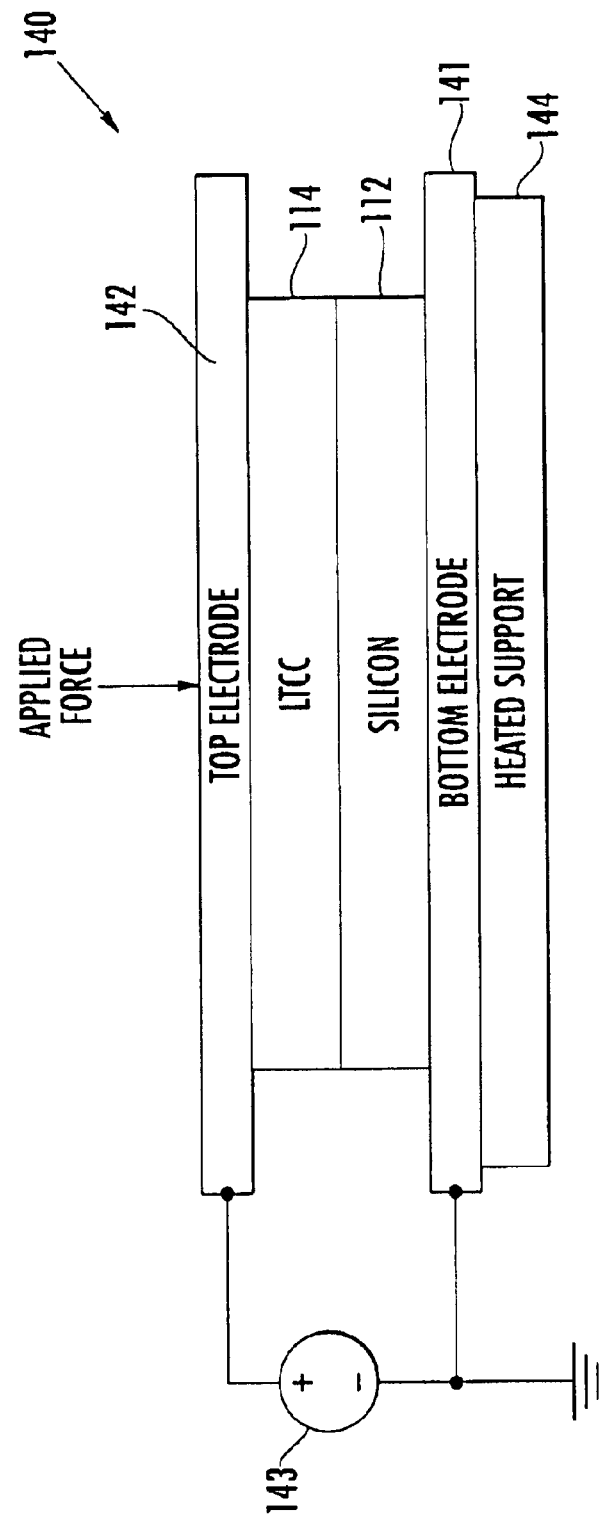
FIG. 5 is a schematic diagram of the electronic device as shown in FIG. 3 being made in an apparatus in accordance with the invention.

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout.

Referring now initially to FIGS. 3–7 the electronic device and method for making the device in accordance with the invention are now described. In particular, as shown in FIGS. 3 and 4, an illustrated embodiment of an electronic device 110 in accordance with the invention is shown. The electronic device 110 differs from the prior art device shown in FIGS. 1 and 2 in that the conventional adhesive layer 31 is replaced by an anodically bonded interface 135 as will be described in greater detail herein.

The electronic device 110 illustratively mounts a single integrated circuit 122 in the package 111 although those of skill in the art will recognize that the invention is also applicable to other electronic devices as well. For example, the electronic device may also be an MCM, or other similar device including one or more integrated circuits 122 contained in a similar mounting package. The electronic device 110 illustratively includes a first member 112 comprising silicon, and a second member 114 comprising a low temperature co-fired ceramic (LTCC) material. The first and second members 112, 114 have opposing surfaces thereof anodically bonded together to form a hermetic seal at the interface 135 therebetween.

As shown in the illustrated embodiment, the first and second members 112, 114 have opposing generally planar major opposing surfaces being anodically bonded together. At least one of the first and second members 112, 114 may comprise at least one cooling structure therein as will be appreciated by those skilled in the art. For example, as shown in the illustrated electronic device 110, the first member 112 includes at least one first micro-fluidic cooling structure therein, such as the illustrated evaporator 116.

The second member 114 may include at least one second micro-fluidic cooling structure aligned with the at least one first micro-fluidic cooling structure of the first member 112. For example, and as shown in the illustrated embodiment of the electronic device 110, the at least one second micro-fluidic cooling structure may comprise at least one micro-fluidic passageway 130.

The electronic device 110 also illustratively includes an integrated circuit 122 adjacent the micro-fluidic passageways 130 of the second member 114. Of course, in other embodiments, more than one integrated circuit may be mounted within the package 111. In addition, an optical/electronic device may also be mounted and cooled as described herein as will be appreciated by those skilled in the art. The integrated circuit 122 also illustratively includes electrical connections 124 which are brought out to the external electrical connections 123 using conventional techniques as will be appreciated by those skilled in the art.

As will also be appreciated by those skilled in the art, in other embodiments of the invention, the integrated circuit 122 may include a back contact layer, not shown, which is also connected to an external electrical connector carried by the second member. In addition, the integrated circuit 122 may be mounted using flip chip bonding techniques in other embodiments.

The other elements of the illustrated electronic device 110 of the invention are indicated with reference numerals incremented by one hundred as compared to the similar elements of the electronic device shown in FIGS. 1 and 2. Accordingly, these common elements need no further discussion herein.

Figure 6:
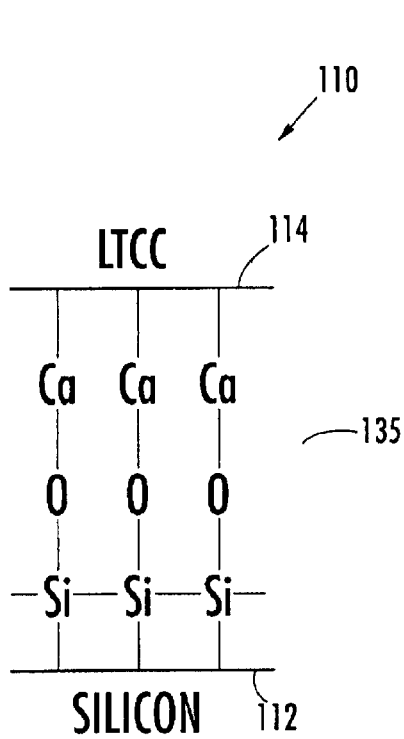
FIG. 6 is a schematic diagram of the anodic bond interface as in the electronic device shown in FIG. 3.
Figure 7:
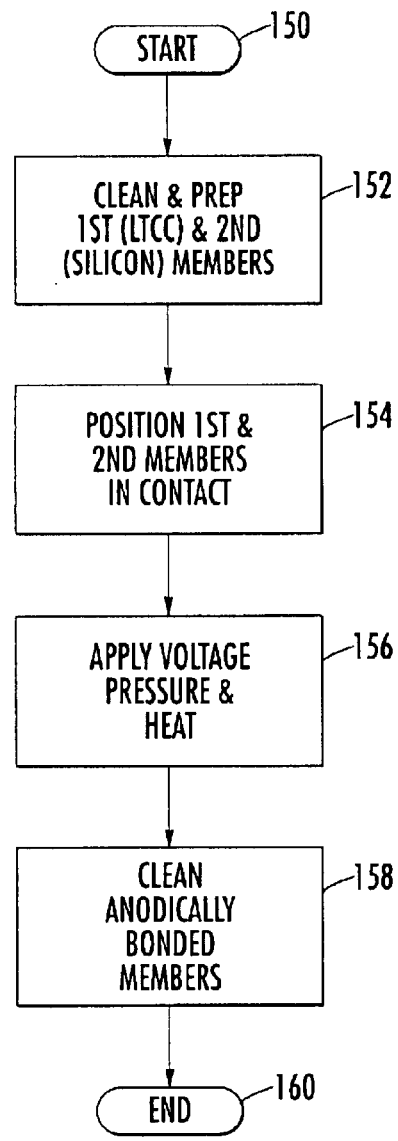
FIG. 7 is a flowchart illustrating the method in accordance with the present invention.

Referring now more particularly to FIGS. 5–7, method aspects of the invention are now described in greater detail. The method is for making an electronic device 110, such as described above. As seen in the flowchart of FIG. 7, from the start (Block 150) the method may include cleaning and preparation of the opposing surfaces of the first and second members 112, 114 at Block 152. Preparation may include polishing or other techniques to ensure that the surface roughness of each opposing surface is within a desired range.

At Block 154 the method includes positioning first and second members 112, 114 so that opposing surfaces thereof are in contact with one another. As described above, the first member 112 comprises silicon and the second member 114 comprises an LTCC material. At Block 156 the opposing surfaces of the first and second members 112, 114 are anodically bonding together.

Referring now briefly to the schematically illustrated apparatus 140 of FIG. 5 an embodiment of anodic bonding is further described. The first and second members 112, 114 may be aligned between the top electrode 142 and the bottom electrode 141 of the apparatus 140. The bottom electrode 141 is also carried by a heated support 144. A voltage source 143 is connected to the top and bottom electrodes 142, 141. The apparatus 140 can provide the necessary voltage, pressure and temperature ranges for efficient anodic bonding of the first and second members 112, 114.

For typical electronic devices such as the illustrated electronic device 110 or MCMs, for example, the voltage source 143 may apply a voltage in a range of about 500 to 1000 volts across the first and second members 112, 114. Similarly, the apparatus may also apply a force such that the pressure between the opposing surfaces is in a range of about 1 to 20 psi. Additionally, the heated support may heat the first and second members 112, 114 to a temperature in a range of about 100 to 150° C. Of course, other voltages, pressures and temperatures are contemplated by the invention and may be used for other devices as will be appreciated by those skilled in the art. After the anodic bonding (Block 156), the bonded first and second members 112, 114 may be cleaned and further processed before stopping (Block 160).

As described above, the first and second members 112, 114 may have substantially planar major opposing surfaces, so that anodic bonding provides a uniform bond across these surfaces to reduce possible stress effects which may otherwise occur due to the difference in thermal coefficients of expansion of the two different materials. The anodic bonding provides a secure and uniform hermetic seal between the members 112, 114 and while overcoming the disadvantages described above resulting from using an adhesive.

The method may further include forming at least one cooling structure in at least one of the first and second members 112, 114. These may be formed before or after anodic bonding, or they may be formed both before and after anodic bonding. The method may also include positioning at least one integrated circuit 122 adjacent the at least one cooling structure, such as adjacent the at least one micro-fluidic cooling passageways 130 in the second or LTCC member 114.

Anodic bonding advantageously provides a hermetic seal between the two members, and significantly reduces or eliminates the loss of cooling fluid at the interface between the two members which could otherwise occur. It is believed without applicants wishing to bound thereto that the anodic bonding causes a coordinate covalent matrix to form at the interface 135 between the first and second members 112, 114 as perhaps best shown in the schematic view of FIG. 6.

Many modifications and other embodiments of the invention will come to the mind of one skilled in the art having the benefit of the teachings presented in the foregoing descriptions and the associated drawings. Accordingly, it is understood that the invention is not to be limited to the embodiments disclosed, and that other modifications and embodiments are intended to be included within the spirit and scope of the appended claims.

That which is claimed is:

1. An electronic device comprising:
   a first member comprising silicon; and
   a second member comprising a low temperature co-fired ceramic (LTCC) material;
   said first and second members having opposing surfaces thereof anodically bonded together to form a hermetic seal therebetween.

2. An electronic device according to claim 1 wherein said first and second members have opposing generally planar major opposing surfaces.

3. An electronic device according to claim 1 wherein at least one of said first and second members comprises at least one cooling structure therein.

4. An electronic device according to claim 1 wherein said first member further comprises at least one first micro-fluidic cooling structure therein.

5. An electronic device according to claim 4 wherein said at least one first micro-fluidic cooling structure comprises an evaporator.

6. An electronic device according to claim 4 wherein said second member further comprises at least one second micro-fluidic cooling structure aligned with the at least one first micro-fluidic cooling structure.

7. An electronic device according to claim 6 wherein said at least one second micro-fluidic cooling structure comprises at least one micro-fluidic passageway.

8. An electronic device according to claim 6 further comprising at least one integrated circuit adjacent said at least one second micro-fluidic cooling structure.

9. An electronic device according to claim 8 wherein said at least one integrated circuit comprises electrical connections, and wherein the second member comprises external electrical connections connected to the electrical connections of said at least one integrated circuit.

10. An electronic device comprising:
    a first member comprising silicon and having at least one first micro-fluidic cooling structure therein;
    a second member comprising a low temperature co-fired ceramic (LTCC) material and having at least one second micro-fluidic cooling structure aligned with the at least one first micro-fluidic cooling structure of said first member;
    said first and second members having opposing surfaces thereof anodically bonded together to form a hermetic seal therebetween; and
    at least one integrated circuit adjacent said at least one second micro-fluidic cooling structure.

11. An electronic device according to claim 10 wherein said first and second members have opposing generally planar major opposing surfaces.

12. An electronic device according to claim 10 wherein said at least one first micro-fluidic cooling structure therein comprises an evaporator.

13. An electronic device according to claim 10 wherein said at least one second micro-fluidic cooling structure comprises at least one micro-fluidic passageway.

14. An electronic device according to claim 10 wherein said at least one integrated circuit comprises electrical connections; and wherein the second member comprises external electrical connections connected to the electrical connections of said at least one integrated circuit.

* * * * *